(12) United States Patent
Landau et al.

(10) Patent No.: US 8,687,370 B2
(45) Date of Patent: Apr. 1, 2014

(54) HOUSING FOR A CHIP ARRANGEMENT AND A METHOD FOR FORMING A HOUSING

(75) Inventors: Stefan Landau, Wehrheim (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 241 days.

(21) Appl. No.: 13/295,134

(22) Filed: Nov. 14, 2011

(65) Prior Publication Data
US 2013/0120940 A1    May 16, 2013

(51) Int. Cl.
*H05K 7/20*   (2006.01)

(52) U.S. Cl.
USPC ...... 361/719; 361/679.54; 361/709; 361/764; 257/777; 174/260

(58) Field of Classification Search
USPC ........ 361/679.46, 679.54, 688, 701–722, 760
See application file for complete search history.

(56) References Cited

U.S. PATENT DOCUMENTS

| | | | |
|---|---|---|---|
| 6,284,982 B1* | 9/2001 | Kusner et al. | 174/255 |
| 6,509,629 B2* | 1/2003 | Yoshimatsu et al. | 257/660 |
| 6,522,555 B2* | 2/2003 | Hirano et al. | 361/760 |
| 7,974,099 B2* | 7/2011 | Grajcar | 361/720 |
| 8,148,646 B2* | 4/2012 | Fan et al. | 174/261 |
| 2001/0012739 A1* | 8/2001 | Grube et al. | 439/862 |
| 2003/0192176 A1* | 10/2003 | Eldridge et al. | 29/832 |
| 2003/0199179 A1* | 10/2003 | Dozier et al. | 439/66 |
| 2010/0027577 A1* | 2/2010 | Dutta | 372/50.1 |
| 2010/0091464 A1* | 4/2010 | Ohnishi et al. | 361/723 |

OTHER PUBLICATIONS

Fundamentals and Applications of Dielectric-Barrier Discharges U. Kogelschatz Abb Corporate Research Ltd Baden, Switzerland May 24, 2000; pp. 1-7.

* cited by examiner

*Primary Examiner* — Courtney Smith

(57) ABSTRACT

A housing for a chip arrangement is provided, the housing including: a carrier including a first carrier side configured to receive a chip arrangement, a second carrier side and one or more through-holes extending from the first carrier side to the second carrier side; at least one electrical connector inserted through a through-hole, the at least one electrical connector arranged to extend from the second carrier side to the first carrier side; wherein the at least one electrical connector may include: a first portion on the first carrier side; a second portion on the first carrier side, wherein the first portion is configured to extend away from the first carrier side at an angle to the second portion; and a third portion on the second carrier side, wherein the third portion is configured to extend away from the second carrier side at an angle to the second portion.

21 Claims, 5 Drawing Sheets

HOUSING FOR A CHIP ARRANGEMENT AND A METHOD FOR FORMING A HOUSING

TECHNICAL FIELD

Various embodiments relate generally to a housing for a chip arrangement and a method for forming a housing.

BACKGROUND

Electrical circuits may produce during their operation, large amounts of heat which may affect the performance of the circuits. Circuit arrangements, e.g. semiconductor relays, e.g. solid state relay SSR circuits, may include power semiconductor devices, which have high-current carrying capacity. Due to the high currents produced in relay circuits due to their high switching frequency, substantial amounts of heat may be produced during their operation. Heat removal systems are needed for improved heat removal from the electrical circuits and to ensure that heat may be removed effectively from modules in which electronic devices, e.g. power semiconductor chips, may be embedded.

The construction of modular relays, e.g. modules for housing relay circuits, e.g. solid state relay circuits, e.g. surface mount solid state relays, and individual surface mount device components may lead to particularly large amounts of heat generated during their operation. Due to limited space and high costs, solid state relays in current surface mount device components do not have a cooling concept or mechanism due to space and cost constraints. The systems are therefore usually current limited, due to the high amount of heat generated during their operation.

Currently available SSR modules which lack any additional cooling elements may have high mounting complexity, due to the need to carry each power device on a separate chip-carrier board. The lack of cooling elements to achieve optimal cooling of the device components results in poor thermal resistance. A currently available SSR module may include multiple chip-carrier boards, e.g. printed circuit boards, each carrying a power device. A carrier, e.g. a plastic platform, may be arranged to support a first chip-carrier board, e.g. a first chip-carrier board may be stacked substantially horizontally to the carrier over the carrier. A further chip-carrier board may then be stacked, e.g. mounted, substantially horizontally to the first chip-carrier board over the first chip-carrier board.

Another currently available SSR module may include a carrier, e.g. a plastic platform, to carry a chip-carrier board. The chip-carrier board may be stacked vertically to the carrier over the carrier, such that a heat dissipation layer formed over the back side of the printed circuit board may be exposed. The current design is insufficient for high current carrying SSR circuits, and are therefore limited to low current carrying circuits, e.g. currents ranging from about 5 A to about 10 A, as the design does not have additional elements in contact with the printed circuit board, to sufficiently improve cooling of the module for high current carrying SSR circuits.

SUMMARY

An embodiment provides a housing for a chip arrangement, the housing including: a carrier including a first carrier side configured to receive a chip arrangement, a second carrier side and one or more through-holes extending from the first carrier side to the second carrier side; at least one electrical connector inserted through a through-hole, the at least one electrical connector arranged to extend from the second carrier side to the first carrier side; wherein the at least one electrical connector may include: a first portion on the first carrier side; a second portion on the first carrier side, wherein the first portion is configured to extend away from the first carrier side at an angle to the second portion; and a third portion on the second carrier side, wherein the third portion is configured to extend away from the second carrier side at an angle to the second portion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Figure 1:
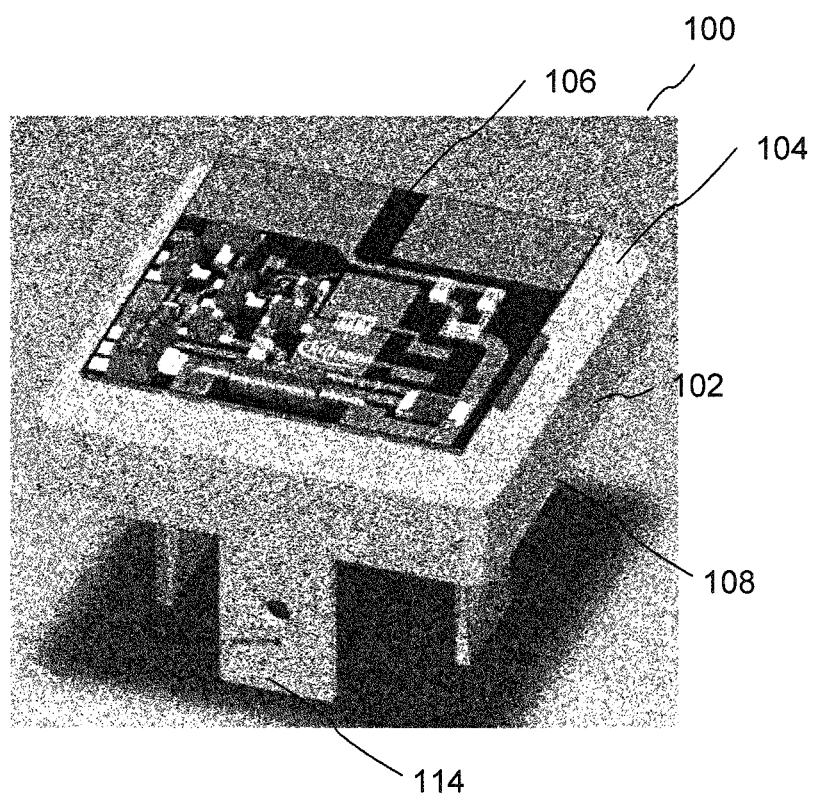
FIG. 1 shows a housing for a chip arrangement according to an embodiment.

FIG. 1 shows a housing 100 for a chip arrangement 106, e.g. a semiconductor die arrangement formed over a printed circuit board, according to an embodiment. Housing 100 may include: carrier 102, e.g. a platform, including first carrier side 104 (which may also be referred to as front side) configured to receive chip arrangement 106, and a second carrier side 108 (which may also be referred to as back side). One or more electrical connectors 114, e.g. a plug-in contact, may be arranged on second carrier side 108 to connect chip arrangement 106 to an external electrical circuit, e.g. to a power supply. The plug-in contact may include e.g. a plug-in-board pin. The plug-in contact may be plugged into a plug board. Carrier 102 may include a platform, e.g. a plastic platform, e.g. a platform including polyvinyl chloride PVC, e.g. a platform including polyamide PA, e.g. a platform including polypropylene PP, e.g. a platform including polyethylene PE. Carrier 102 may include a material suitable for mechanical processing, e.g. carrier 102 may include a polymer, e.g. a metal-polymer composition, e.g. a metal-polymer composition similar to a printed circuit board.

Additional cooling bodies may be provided to remove heat due to component warming, and to optimally cool the device components. Electrical connectors 114, e.g. a plug-in contact, may be configured according to a special geometry such that at least one electrical connector 114 may function as an additional cooling body, e.g. an additional cooling surface for heat removal and to control power dissipation in device components.

Figure 2A:
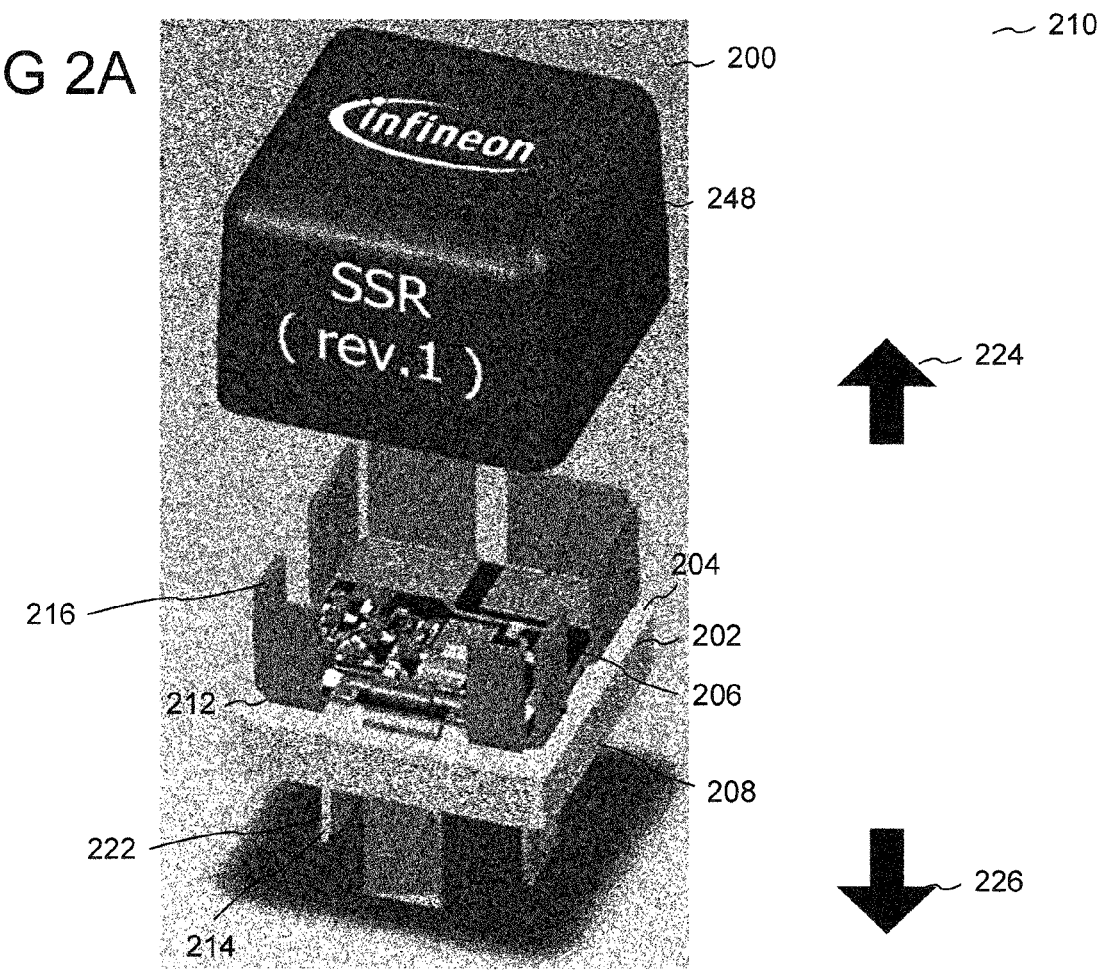
FIG. 2A shows a housing for a chip arrangement according to an embodiment.
Figure 2B:
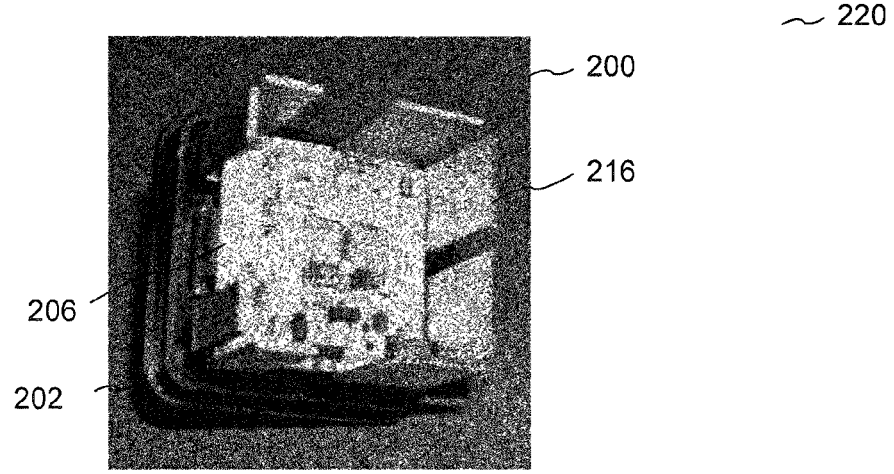
FIG. 2B shows a housing for a chip arrangement according to an embodiment.

FIG. 2A and FIG. 2B show a side-view 210 and top view 220 respectively of a housing 200 for a chip arrangement 206 according to an embodiment.

Housing 200 may include a carrier 202, e.g. a platform, e.g. a plastic platform, including a first carrier side 204 configured to receive a chip arrangement 206, e.g. a semiconductor die arrangement formed over a printed circuit board, a second carrier side 208 and one or more through-holes 212 extending from first carrier side 204 to second carrier side 208; at least one electrical connector 214 inserted through a through-hole 212, at least one electrical connector 214 arranged to extend from second carrier side 208 to first carrier side 204, wherein at least one electrical connector 214 may include: a first portion 216 on first carrier side 204; a second portion 218 (see FIGS. 2C and 2D) on first carrier side 204, wherein first portion 216 may be configured to extend away from first carrier side 204 at an angle to second portion 218; and a third portion 222 on second carrier side 208, wherein third portion 222 may be configured to extend away from second carrier side 208 at an angle to second portion 218.

Figure 2C:
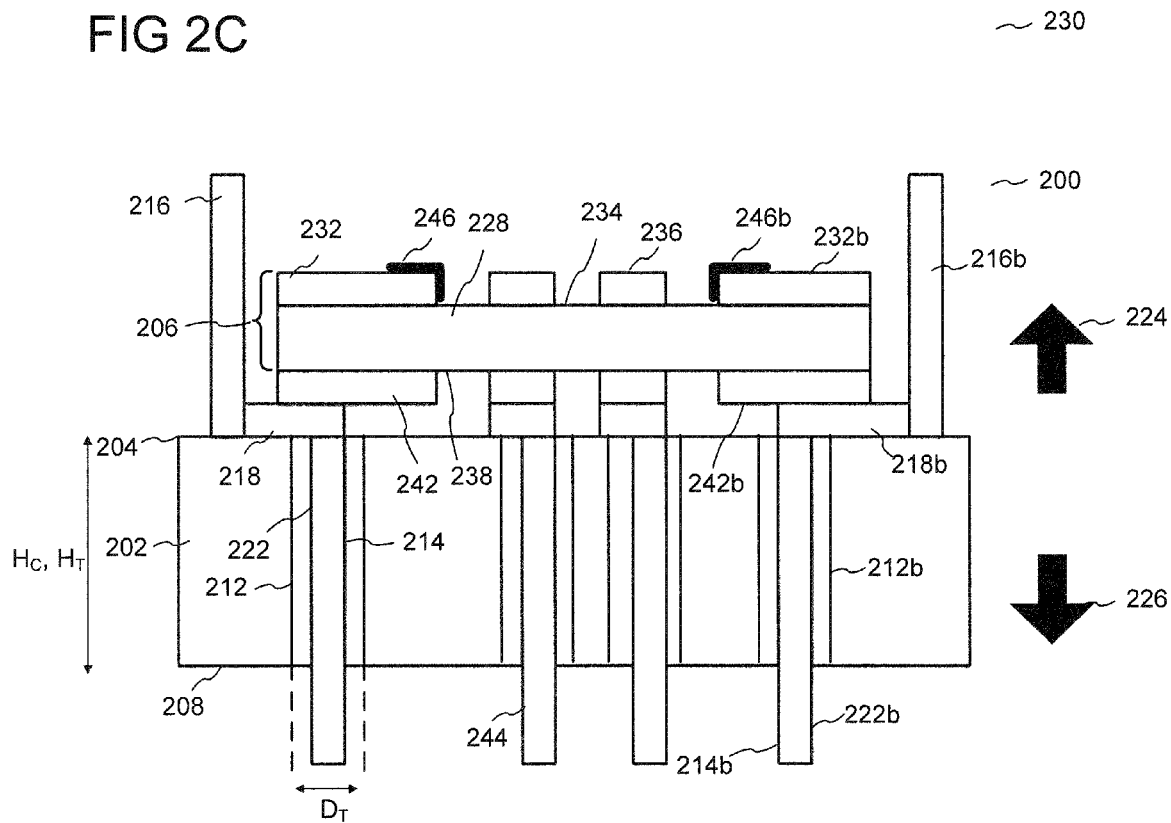
FIG. 2C shows a housing for a chip arrangement according to an embodiment.

FIG. 2C shows a side view 230 of housing 200.

First carrier side 204 may be configured to face a direction 224 opposite to a direction 226 which second carrier side 208 faces.

At least one electrical connector 214 may be configured to be in thermal connection with chip arrangement 206 and to transport heat away from chip arrangement 206.

Second portion 218 of electrical connector 214 may be configured to be in thermal connection with a heat dissipation layer, e.g. heat dissipation layer 242 of chip arrangement 206 and to transport heat away from chip arrangement 206.

Third portion 222 may be configured to connect chip arrangement 206 to an external electrical circuit. Third portion 222 may include a plug-in contact. Third portion 222 may include a plug-in contact for a standard relay in accordance with the International Standards Organization, e.g. ISO Maxi, ISO Mini. Third portion 222 may include a straight connector in accordance with the International Standards Organization, e.g. ISO Maxi, ISO Mini. Third portion 222 may include a pin connector in accordance with the International Standards Organization, e.g. ISO Maxi, ISO Mini. Third portion 222 may be configured to transport electrical current between chip arrangement 206 and an external circuit, the electrical current ranging from about 1 A to about 80 A, e.g. about 5 A to about 70 A, e.g. about 10 A to about 60 A.

First carrier side 204 of carrier 202 of housing 200 may be configured to receive chip arrangement 206 including a chip-carrier 228, e.g. a printed circuit board, and at least one chip 232, 232b formed over a first chip-carrier side 234 (which may also be referred to as front chip-carrier side) and wherein a second chip-carrier side 238 (which may also be referred to as back chip-carrier side) faces first carrier side 204. Chip arrangement 206 may be formed over first carrier side 204.

First chip-carrier side 234 may be configured to face a direction 224 opposite to a direction 226 which second chip-carrier side 238 faces.

First carrier side 204 may be configured to receive chip arrangement 206 including a chip-carrier 228, wherein chip-carrier 228 may include a printed circuit board. First carrier side 204 may be configured to receive a chip arrangement 206 including a chip-carrier 228 and at least one chip 232, 232b, wherein chip 232, 232b may include a power device, e.g. one or more semiconductor power devices, e.g. one or more semiconductor transistors, e.g. one or more semiconductor power transistors, e.g. one or more semiconductor power MOS transistors, e.g. one or more semiconductor power bipolar transistors, e.g. one or more semiconductor power field effect transistors, e.g. one or more semiconductor power insulated gate bipolar transistors IGBT, e.g. one or more thyristors, e.g. one or more MOS controlled thyristors, e.g. one or more silicon controlled rectifiers, e.g. one or more semiconductor power schottky diodes e.g. one or more semiconductor Silicon carbide SiC diodes, e.g. one or more GaN devices. A power device may be used for switching, e.g. rectification. Chip 232, 232b may include a power device wherein the power device may form at least part of an embedded power logic system, e.g. a solid state relay SSR circuit. An embedded power logic system may include at least one power device and at least one logic device, wherein the at least one power device comprises at least one power device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device, and wherein the at least one logic device comprises at least one logic device from the group consisting of: a transistor, a resistor, a diode, an inductor and a capacitor. The voltage rating for a power device may range from about 10 V to about 3000 V, e.g. about 20 V to about 1000 V, e.g. about 30 V to about 150V. The current rating for a power device may range from about 10 A to about 2000 A, e.g. about 20 A to about 1000 A, e.g. about 30 A to about 100 A. First carrier side 204 may be configured to receive a chip arrangement 206 including a chip-carrier 228 and at least one chip 232, 232b formed over a first chip-carrier side 234 and wherein a second chip-carrier side 238 faces first carrier side 204.

Chip arrangement 206 may include chip-carrier 228, e.g. a printed a circuit board, and at least one chip 232, 232b, wherein at least one chip 232, 232b, may include a power device, e.g. a power transistor, e.g. a power metal-oxide-semiconductor field effect transistor MOSFET.

Chip arrangement 206 may include chip-carrier 228, e.g. a printed a circuit board, wherein one or more further chips, 236 may be formed over a side 234, e.g. a first chip-carrier side 234, of chip-carrier 228. One or more further chips, 236 may include passive and active device elements, e.g. diodes, transistors, capacitors, inductors.

Chip arrangement 206 may include a solid state relay circuit, for example, chip arrangement 206 may include a chip-carrier 228, wherein a solid state relay circuit may be formed over a side, e.g. a first chip-carrier side 234 of chip-carrier 228, e.g. a solid state relay circuit may be formed over a side of a printed circuit board 228. The solid state relay circuit may include electronic components for logic, e.g. a driver integrated circuit, and electronic components for switching, e.g. a power device, e.g. a power transistor, e.g. a power MOSFET. The driver integrated circuit may be configured to control the gating of the power MOSFET. A vertical current may be carried in the power MOSFET, e.g. the power MOSFET may include a vertical transistor, with a drain contact formed on the bottom side of the MOSFET die, wherein current may flow in a direction towards the drain contact. Therefore, current may be carried in a direction towards chip-carrier 228, e.g. in direction 226. The driver integrated circuit may be configured as a control for sensing, e.g. current sensing, e.g. sensing device temperatures.

At least one heat dissipation layer 242 may be formed over second chip-carrier side 238. At least one heat dissipation layer 242 may be thermally connected, e.g. by means of a solder layer, e.g. by means of a thermally conductive solder layer, e.g. by means of a diffusion solder layer, to at least one chip 232 on first chip-carrier side 234. At least one heat dissipation layer 242 may be thermally connected, e.g. by means of a solder layer, e.g. by means of a thermally conductive solder layer, e.g. by means of a diffusion solder layer, to a layer 246 formed over at least one chip 232 on first chip-carrier side 234. Layer 246 may function as an electrical contact 246 for chip 232, e.g. layer 246 may include a copper contact. Layer 246 may be thermally conductive and electrically conductive and may be formed directly on at least one chip 232. At least one heat dissipation layer 242 may be thermally connected to layer 246 formed over at least one chip 232 on first chip-carrier side 234, such that the surface area of contact between layer 246 and heat dissipation layer 242 may be maximized. At least one heat dissipation layer 242 may be formed directly on second chip-carrier side 238, e.g. directly on the printed circuit board. At least one heat dissipation layer 242 may have a thickness ranging from about 35 μm to about 100 μm, e.g. from about 50 μm to about 95 μm, e.g. from about 80 μm to about 90 μm. At least one heat dissipation layer 242 may include a material including at least one from the following group of materials, the group consisting of: copper, phosphorus, zinc, iron and a copper alloy, e.g. K80, K65 from the company Wieland®.

At least one electrical connector 214 may be thermally connected to at least one chip 232 via heat-dissipation layer 242 formed over second chip-carrier side 238. At least one electrical connector 214 may be thermally connected, e.g. by means of a solder layer, e.g. by means of a thermally conductive solder layer, e.g. by means of a diffusion solder layer, to heat dissipation layer 242. Second portion 218 of electrical connector 214 may be thermally connected, e.g. by means of a solder layer, e.g. by means of a thermally conductive solder layer, e.g. by means of a diffusion solder layer, to chip 232 via a heat-dissipation layer 242 formed over second chip-carrier side 238. Second portion 218, may be configured such that it may lie substantially horizontal to first carrier side 204, e.g. substantially level on a surface of first carrier side 204. Second portion 218 may be arranged such that the contact area between heat-dissipation layer 242 and second portion 218 may be maximized, e.g. the contact area between heat-dissipation layer 242 and second portion 218 may be as large as possible. Second portion 218 may be configured such that it may lie substantially horizontal to second chip-carrier side 238, such that heat-dissipation layer 242 formed over second chip-carrier side 238 may lie substantially level on second portion 218.

Housing 200 may include more than one electrical connectors 214. Housing 200 may include a plurality of electrical connectors 214, 214b. Electrical connectors 214b may include all the features described with respect to electrical connector 214.

The plurality of electrical connectors 214, 214b, may each be thermally connected to a different device component on first chip-carrier side 234. Electrical connector 214 may be thermally connected to chip 232, wherein chip 232 may include a power device. Electrical connector 214b may be thermally (and optionally also electrically) connected to chip 232b, wherein chip 232b may include another power device.

The plurality of electrical connectors 214, 214b, may each be thermally connected to a separate or different heat dissipation layer 242, 242b formed over second chip-carrier side 238. Second portion 218 of electrical connector 214 may be thermally connected to chip 232 via heat-dissipation layer 242 formed over second chip-carrier side 238. Second portion 218b of electrical connector 214b may be thermally connected to chip 232b via heat-dissipation layer 242b formed over second chip-carrier side 238.

A plurality of heat dissipation layers 242, 242b may be formed over second chip-carrier side 238. The plurality of heat dissipation layers 242, 242b may each be thermally connected to a different device component on first chip-carrier side 234, e.g. heat dissipation layer 242 may be thermally connected to chip 232, wherein chip 232 may include a power device, e.g. heat dissipation layer 242b may be thermally connected to chip 232b, wherein chip 232b may include a power device.

Heat dissipation layers 242, 242b may be formed over second chip-carrier side 238, such that a percentage of the surface area of second chip-carrier side 238 may be covered by heat dissipation layers 242, 242b, e.g. about 10% to about 90% of the surface area of second chip-carrier side 238 may be covered by heat dissipation layers 242, 242b, e.g. about 60% to about 95% of the surface area of second chip-carrier side 238 may be covered by heat dissipation layers 242, 242b, e.g. about 50% to about 90% of the surface area of second chip-carrier side 238 may be covered by heat dissipation layers 242, 242b, e.g. about 60% to about 85%, e.g. about 60% to about 80%.

Housing 200 may include one or more further electrical connectors 244. Further electrical connector 244 may include part of a plug-in contact for the solid-state relay circuit of chip arrangement 206. However, further electrical connector 244 may be configured similarly to electrical connector 214 except that further electrical connector 244 does not include first portion 216 configured to extend away from first carrier side 204 at an angle to second portion 218. Flexibility may be obtained in design of housing 200, such that further electrical connector 244 may be thermally connected to passive elements, e.g. logic circuits, e.g. a resistor, e.g. a diode, e.g. an inductor, e.g. a capacitor, for heat dissipation and electrical connector 214 may be thermally connected to active elements, e.g. switching circuits, e.g. one or more semiconductor power devices, e.g. one or more semiconductor transistors, e.g. one or more semiconductor power transistors, e.g. one or more semiconductor power MOS transistors, e.g. one or more semiconductor power bipolar transistors, e.g. one or more semiconductor power field effect transistors, e.g. one or more semiconductor power insulated gate bipolar transistors IGBT, e.g. one or more thyristors, e.g. one or more MOS controlled thyristors, e.g. one or more silicon controlled rectifiers, e.g. one or more semiconductor power schottky diodes e.g. one or more semiconductor silicon carbide SiC diodes, e.g. one or more GaN devices for heat dissipation. Further electrical connector 244 may include a plug-in contact for a standard relay in accordance with the International Standards Organization, e.g. ISO Maxi, ISO Mini. Further electrical connector 244 may include a straight connector in accordance with the International Standards Organization, e.g. ISO Maxi, ISO Mini. Further electrical connector 244 may include a pin connector in accordance with the International Standards Organization, e.g. ISO Maxi, ISO Mini. Further electrical connector 244 may be configured to transport electrical current between chip arrangement 206 and an external circuit, the electrical current ranging from about 1 A to about 80 A, e.g. about 5 A to about 70 A, e.g. about 10 A to about 60 A.

Electrical connectors 214, 214b may include at least one of the materials from the following group, the group consisting of: e.g. copper, nickel, zinc, iron and a copper alloy, e.g. K80, K65 from the company Wieland®.

One or more further electrical connectors 244 may include at least one of the materials from the following group, the group consisting of: e.g. copper, nickel, zinc, iron and a copper alloy, e.g. K80, K65 from the company Wieland®.

Carrier 202 may include at least one from the following group of materials, the group consisting of: plastic, polyvinyl chloride PVC, polyethylene terephthalate PET, polyimide PI, Epoxy EP, phenol resin PF, polyamide PA, polypropylene PP, polyethylene PE, a polymer, and a metal-polymer composition. Carrier 202 may include at least one of a filler or fiber-reinforced-polymer, wherein the at least one of a filler or fiber-reinforced-polymer includes at least from one from the group of materials, the group consisting of: plastic, polyvinyl chloride PVC, polyethylene terephthalate PET, polyimide PI, Epoxy EP, phenol resin PF, polyamide PA, polypropylene PP, polyethylene PE, a polymer.

Figure 2D:
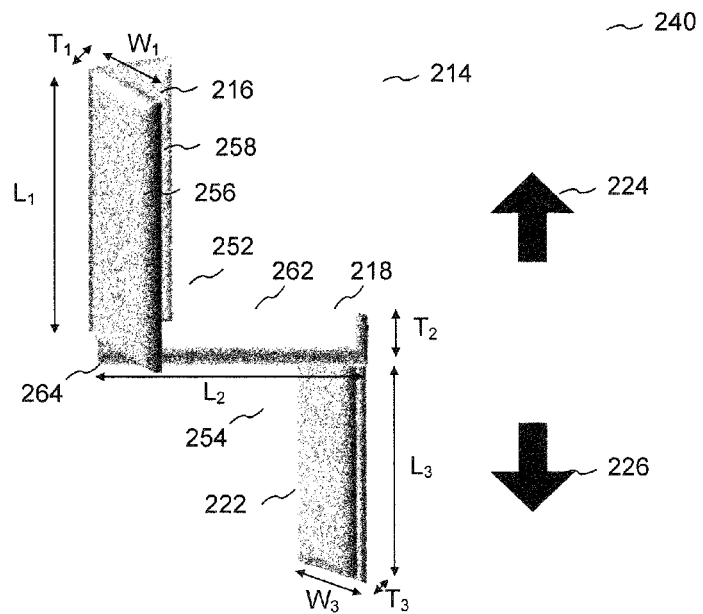
FIG. 2D shows part of a housing for a chip arrangement according to an embodiment.

FIG. 2D shows an illustration 240 of electrical connector 214 of housing module 200 according to an embodiment.

First portion 216 may be configured such that the surface area of first portion 216 may be maximized on first carrier side 204, e.g. the surface area of first portion 216 may be maximized on first carrier side 204, within the volume of protective cap 248, which may be configured to engage with carrier 202 to isolate chip arrangement 206 from the surroundings.

First portion 216 may include one or more three-dimensional panels 256, 258 configured at an angle 252 to second portion 218, wherein one or more three-dimensional panels 256, 258 may be configured to extend away from first carrier side 204. First portion 216 may include a three-dimensional panel 256 having a length $L_1$, width $W_1$ and thickness $T_1$, wherein length $L_1$ defines the extent to which first portion 216 extends away from first carrier side 204, e.g. length $L_1$ may define the distance between second portion 218 and a distal point of first portion 216 from second portion 218.

Length $L_1$ may range from about 1 mm to about 50 mm, e.g. about 2 mm to about 25 mm, e.g. about 3 mm to about 5 mm.

Width $W_1$ may range from about 1 mm to about 50 mm, e.g. about 2 mm to about 25 mm, e.g. about 3 mm to about 5 mm.

Thickness $T_1$ may range from about 0.1 mm to about 4 mm, e.g. about 0.5 mm to about 3 mm, e.g. about 1 mm to about 2 mm.

$L_1$ may be larger than the height of chip arrangement 206, chip arrangement 206 including chip-carrier 228, e.g. a printed circuit board, and at least one chip 232 formed over a first chip-carrier side 234. In other words, first portion 216 may extend away from first carrier side 204 farther than the height of chip arrangement 206.

Second portion 218, may have a length $L_2$ and a width $W_2$ (not shown), wherein the surface area defined by $L_2$ and $W_2$, e.g. $L_2 \times W_2$, defines the surface area of second portion 218 which lies on first carrier side 204.

Surface area defined by $L_2$ and $W_2$, e.g. $L_2 \times W_2$, may define the surface area of second portion 218 in contact with heat dissipation layer 242. Heat dissipation layer 242 may be configured to have the same surface area $L_2 \times W_2$ as second potion 218. The geometry of second portion 218 may be flexibly chosen, e.g. second portion may be rectangular shaped, e.g. second portion may include a polygon shape. Second portion 218 and heat dissipation layer 242 may be arranged such that the surface area of contact between heat dissipation layer 242 and surface area $L_2 \times W_2$ of second portion 218 may be maximized.

Surface area defined by $L_2$ and $W_2$, e.g. $L_2 \times W_2$, may define the surface area of second portion 218 which allows second portion 218 to lie substantially horizontal to first carrier side 204, e.g. substantially level on a surface of first carrier side 204, and substantially horizontal to second chip-carrier side 238. Therefore allowing heat-dissipation layer 242 formed over second chip-carrier side 238 to lie substantially level on second portion 218.

Second portion 218 may have a surface area ranging from about 1 mm² to about 2500 mm².

Second portion 218 may have a thickness $T_2$ ranging from about 0.1 mm to about 4 mm, e.g. about 0.5 mm to about 3 mm, e.g. about 1 mm to about 2 mm.

First portion 216 may be configured at an angle 252 ranging from about 75° to about 105°, e.g. about 80° to about 100°, e.g. about 85° to about 95°, to second portion 218. First portion 216 may be configured at an angle 252 ranging from about 75° to about 105°, e.g. about 80° to about 100°, e.g. about 85° to about 95°, to the planar surface area defined by $L_2 \times W_2$ of second portion 218. First portion 216 may be configured at an angle 252 ranging from about 75° to about 105°, e.g. about 80° to about 100°, e.g. about 85° to about 95°, to front side 262 of second portion 218 defined by surface area $L_2 \times W_2$. Front side 262 may be arranged to face direction 224.

First portion 216 may be configured substantially vertically to second portion 218.

First portion 216 may be configured substantially vertically to first carrier side 204.

Third portion 222 may be configured at an angle 254 ranging from about 75° to about 105°, e.g. about 80° to about 100°, e.g. about 85° to about 95°, to second portion 218 Third portion 222 may be configured at an angle 254 ranging from about 75° to about 105°, e.g. about 80° to about 100°, e.g. about 85° to about 95°, to the planar surface area defined by $L_2 \times W_2$ of second portion 218. Third portion 222 may be configured at an angle 254 ranging from about 75° to about 105°, e.g. about 80° to about 100°, e.g. about 85° to about 95°, to back side 264 of second portion 218 defined by surface area $L_2 \times W_2$. Back side 264 may be arranged to face direction 226.

Third portion 222 may be configured substantially vertically to second portion 218.

Third portion 222 may be configured substantially vertically to second carrier side 208.

Third portion 222 may be configured such that it includes a plug-in contact in accordance with ISO standards.

First portion 216 and second portion 218 may include a single body, in other words, first portion 216 and second portion 218 may be formed from a single material.

At least one of the first portion 216, second portion 218 and third portion 222 may include a material having a thickness ranging from about 0.1 mm to about 4 mm, e.g. about 0.5 mm to about 3 mm, e.g. about 1 mm to about 2 mm.

At least one through-hole 212 extending from first carrier side 204 to second carrier side 208 may be configured to allow at least part of one electrical connector 214, e.g. first portion 216, e.g. second portion 218, e.g. third portion 222, to pass through through-hole 212 from second carrier side 208 to first carrier side 204.

Through-hole 212 may have a diameter $D_T$ ranging from about 0.1 mm to about 10 mm, e.g. about 0.5 mm to about 5 mm, e.g. about 1 mm to about 4 mm. Diameter $D_T$ of through-hole 212 may be configured to be larger than the thickness of at least part of one electrical connector 214, e.g. first portion 216, e.g. second portion 218, e.g. third portion 222. $D_T$ may be larger than $T_1$. $D_T$ may be larger than $T_2$. $D_T$ may be larger than $T_3$.

Through-hole 212, extending from first carrier side 204 to second carrier side 208; may have a height $H_T$, which may be equal to the height $H_C$ of carrier 102.

Through-hole 212 may have a length $L_T$ ranging from about 0.1 mm to about 60 mm, e.g. about 2 mm to about 30 mm, e.g. about 2 mm to about 8 mm. Length $L_T$ of through-hole 212 may be configured to be larger than the width of at least part of one electrical connector 214, e.g. first portion 216, e.g. second portion 218, e.g. third portion 222. $L_T$ may be larger than $W_1$. $L_T$ may be larger than $W_2$. $L_T$ may be larger than $W_3$.

First portion 216, second portion 218 and third portion 222 may include a single body, in other words, first portion 216, second portion 218 and third portion 222 may be formed from a single material.

Figure 3:
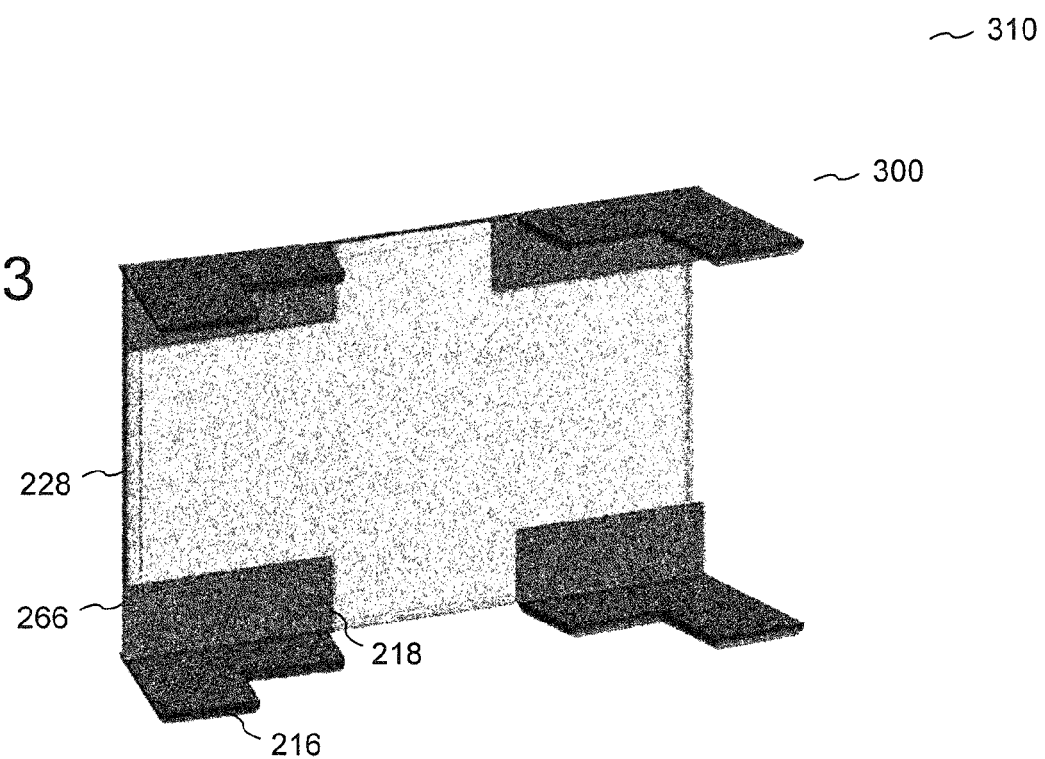
FIG. 3 shows part of a housing for a chip arrangement according to an embodiment.

FIG. 3 shows part of housing 300 according to an embodiment. The basic functionalities of the features described with respect to housing 200 are applicable to housing 300 described below. Identical features as to those described with respect to housing 200 are denoted with the same reference signs.

Housing 300 may include a carrier 202, e.g. a platform, e.g. a plastic platform, including a first carrier side 204 configured to receive a chip arrangement 206 e.g. a semiconductor die arrangement formed over a printed circuit board, a second carrier side 208 and one or more through-holes 212 extending from first carrier side 204 to second carrier side 208; at least one electrical connector 214 inserted through a through-hole 212, the at least one electrical connector 214 arranged to extend from second carrier side 208 to first carrier side 204, the at least one electrical connector 214 including a first portion 216 on first carrier side 204; a second portion 218 on first carrier side 204, wherein first portion 216 may be configured to extend away from first carrier side 204 at an angle to second portion 218; and a third portion 222 on second carrier side 208, wherein third portion 222 may be configured to extend away from second carrier side 208 at an angle to second portion 218.

Housing 300 may include all the features described with respect to housing 200 above, except that second portion 218 may be formed, e.g. laminated, directly on second chip-carrier side 238, e.g. directly on the printed circuit board. Second portion 218 may replace heat dissipation layer 242 formed over second chip-carrier side 238 and second portion 218 may be thermally connected to at least one chip 232 on first chip-carrier side 234.

Second portion 218 may be formed directly on second chip-carrier side 238, e.g. directly on the printed circuit board.

Second portion 218 may be thermally connected to at least one chip 232. Second portion 218, may be configured such that it may lie substantially horizontal to first carrier side 204, e.g. substantially level on a surface of first carrier side 204. Second portion 218, may be configured such that it may lie substantially horizontal to second chip-carrier side 238.

Housing 200 may include a plurality of electrical connectors 214, 214b.

Each plurality of second portions 218, 218b may each be thermally connected to a different device component on first chip-carrier side 234, e.g. second portion 218 may be thermally connected to chip 232, wherein chip 232 may include a power device, e.g. second portion 218b may be thermally connected to device 232b, wherein chip 232b may include a power device.

Second portions 218, 218b may be formed over second chip-carrier side 238, such that a percentage of the surface area of second chip-carrier side 238 may be covered by second portions 218, 218b, e.g. about 10% to about 90% of the surface area of second chip-carrier side 238 may be covered by second portions 218, 218b, e.g. about 60% to about 95% of the surface area of second chip-carrier side 238 may be covered by second portions 218, 218b, e.g. about 50% to about 90% of the surface area of second chip-carrier side 238 may be covered by second portions 218, 218b, e.g. about 60% to about 85%, e.g. about 60% to about 80%.

Second portions 218, 218b may be formed, e.g. laminated, directly on second chip-carrier side 238 with a laminate 266, e.g. solder paste, e.g. a glue, e.g. a thermally conductive paste, e.g. by means of a solder layer, e.g. by means of a thermally conductive solder layer, e.g. by means of a diffusion solder layer. At least one of second portions 218, 218b may be thermally connected to layer 246 formed over at least one chip 232 on first chip-carrier side 234, such that the surface area of contact between layer 246 and at least one of second portions 218, 218b may be maximized.

Figure 4:
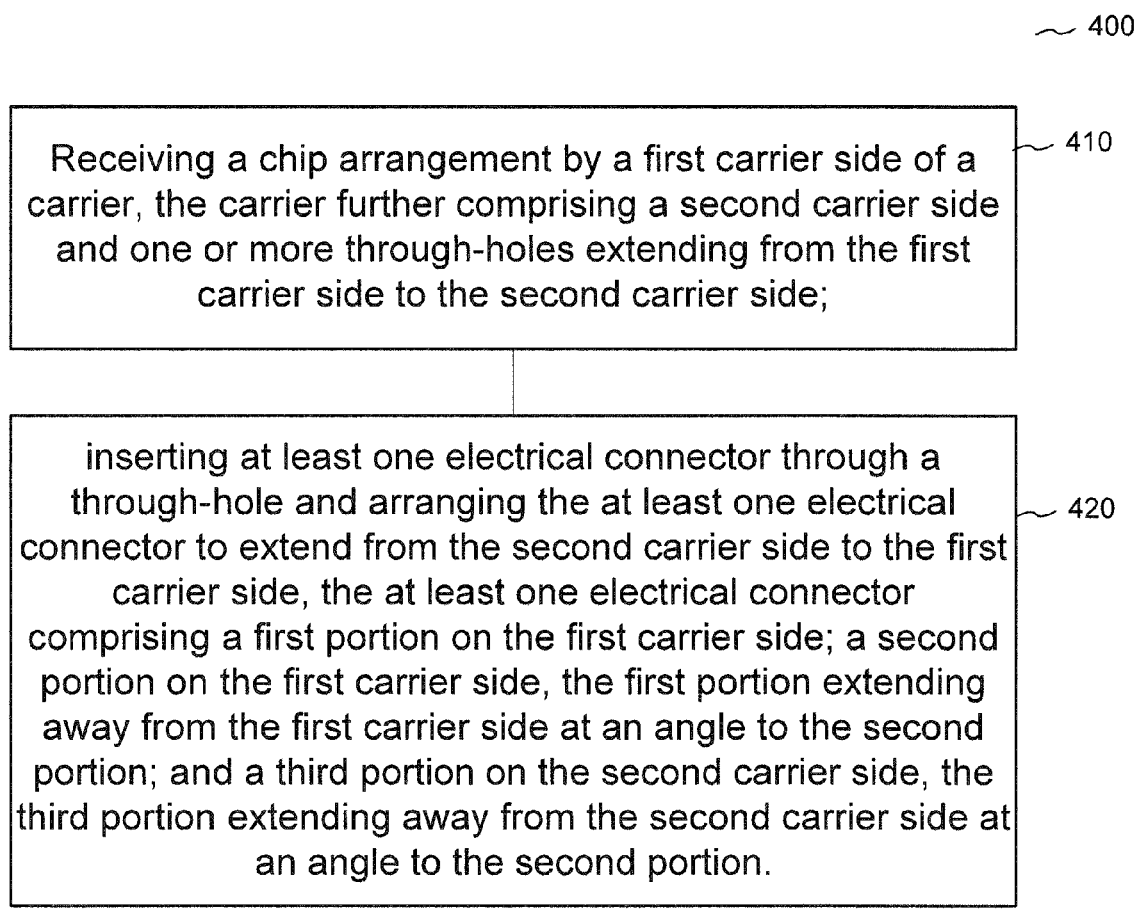
FIG. 4 shows a method for forming a housing for a chip arrangement according to an embodiment.

FIG. 4 shows a method 400 for forming a housing for a chip arrangement, the method including:

receiving a chip arrangement by a first carrier side of a carrier, the carrier further including a second carrier side and one or more through-holes extending from the first carrier side to the second carrier side (in 410); and inserting at least one electrical connector through a through-hole and arranging the at least one electrical connector to extend from the second carrier side to the first carrier side, the at least one electrical connector including a first portion on the first carrier side; a second portion on the first carrier side, the first portion extending away from the first carrier side at an angle to the second portion; and a third portion on the second carrier side, the third portion extending away from the second carrier side at an angle to the second portion (in 420).

Various embodiments provide a housing for a chip arrangement, the housing including: a carrier including a first carrier side configured to receive a chip arrangement, a second carrier side and one or more through-holes extending from the first carrier side to the second carrier side; at least one electrical connector inserted through a through-hole, the at least one electrical connector arranged to extend from the second carrier side to the first carrier side; wherein the at least one electrical connector may include: a first portion on the first carrier side; a second portion on the first carrier side, wherein the first portion is configured to extend away from the first carrier side at an angle to the second portion; and a third portion on the second carrier side, wherein the third portion is configured to extend away from the second carrier side at an angle to the second portion.

According to an embodiment, the second portion is configured substantially horizontal to the first carrier side.

According to an embodiment, the first portion is configured at an angle ranging from about 75° to about 105° to the second portion.

According to an embodiment, the third portion is configured at an angle ranging from about 75° to about 105° to the second portion.

According to an embodiment, the first portion, second portion and third portion include a single body.

According to an embodiment, the third portion is configured to connect the chip arrangement to an external electrical circuit.

According to an embodiment, the third portion includes a plug-in contact.

According to an embodiment, the at least one electrical connector is configured to be in thermal connection with the chip arrangement and to transport heat away from the chip arrangement.

According to an embodiment, the second portion is configured to be in thermal connection with a heat dissipation layer of the chip arrangement.

According to an embodiment, at least one of the first portion, second portion and third portion includes a material having a thickness ranging from about 35 µm to about 100 µm.

According to an embodiment, the first portion of the at least one electrical connector has a length ranging from about 1 mm to about 25 mm.

According to an embodiment, the first carrier side is configured to receive a chip arrangement comprising an embedded power logic system.

According to an embodiment, the first carrier side is configured to receive a chip arrangement including a solid state relay.

According to an embodiment, the first carrier side is configured to receive a chip arrangement including a chip-carrier and at least one chip formed over a first chip-carrier side and wherein a second chip-carrier side faces the first carrier side.

According to an embodiment, the at least one electrical connector is thermally connected to the at least one chip via a heat-dissipation layer formed over the second chip-carrier side.

According to an embodiment, the second portion is thermally connected to the at least one chip via a heat-dissipation layer formed over the second chip-carrier side.

According to an embodiment, the first carrier side is configured to receive a chip arrangement including a chip-carrier, wherein the chip-carrier includes a printed circuit board.

According to an embodiment, the first carrier side is configured to receive a chip arrangement including a chip-carrier and at least one chip, wherein the chip includes a power device.

According to an embodiment, the third portion is configured to transport electrical current between the chip arrangement and an external circuit, the electrical current ranging from about 1 A to about 80 A.

According to an embodiment, the electrical connector includes at least one of the materials from the following group, the group consisting of: e.g. copper, nickel, zinc, iron and a copper alloy.

According to an embodiment, the carrier includes at least one from the following group of materials, the group consisting of: plastic, polyvinyl chloride PVC, polyethylene terephthalate PET, polyimide PI, Epoxy EP, phenol resin PF, polyamide PA, polypropylene PP, polyethylene PE, a polymer, and a metal-polymer composition.

According to an embodiment, the carrier includes at least one of a filler or fiber-reinforced-polymer, the at least one of a filler or fiber-reinforced-polymer including at least from one from the group of materials, the group consisting of: plastic, polyvinyl chloride PVC, polyethylene terephthalate PET, polyimide PI, Epoxy EP, phenol resin PF, polyamide PA, polypropylene PP, polyethylene PE and a polymer.

According to various embodiments, the plug-in contact of a housing for a chip-arrangement, e.g. a housing for a solid-state relay circuit, may be configured according to a special geometry, wherein the plug-in contact extends to the chip side of the printed circuit board, maximizing the surface area of the plug-in contact on the chip side of the printed circuit board, such that one or more pins of the plug-in contact may function as additional cooling bodies for heat removal from warming device components on the chip side of the printed circuit board. When temperatures greater than approximately 85° C. are reached by the device components of the chip arrangement, a 40 A relay circuit may be able to dissipate approximately 2 W to 4 W of power, with the new additional cooling bodies for heat removal. New product designs with new functions are made possible. Due to the added heat removal, higher circuit currents are achieved with device components. The device components are optimally cooled and therefore, device reliability may be increased. The thermal resistance of the circuit may be improved. Lower complexity of components and cost savings may be achieved due to an increase in device components integration density, e.g. only one power semiconductor element, may be needed.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A housing for a chip arrangement, the housing comprising:
    a carrier comprising a first carrier side configured to receive a chip arrangement, a second carrier side and one or more through-holes extending from the first carrier side to the second carrier side;
    at least one electrical connector inserted through one of the one or more through-holes, the at least one electrical connector arranged to extend from the second carrier side to the first carrier side;
    wherein the at least one electrical connector comprises:
    a first portion on the first carrier side;
    a second portion on the first carrier side, wherein the first portion extends away from the first carrier side at an angle to the second portion; and
    a third portion on the second carrier side, wherein the third portion extends away from the second carrier side at an angle to the second portion,
    wherein the chip arrangement comprises a chip-carrier and at least one chip formed over a first chip-carrier side and wherein a second chip-carrier side faces the first carrier side, and
    wherein the at least one electrical connector is thermally connected to the at least one chip via a heat-dissipation layer formed over the second chip-carrier side.

2. The housing of claim 1,
    wherein the second portion is configured substantially horizontal to the first carrier side.

3. The housing of claim 1,
    wherein the first portion is configured at an angle ranging from about 75° to about 105° to the second portion.

4. The housing of claim 1,
    wherein the third portion is configured at an angle ranging from about 75° to about 105° to the second portion.

5. The housing of claim 1,
    wherein the first portion, second portion and third portion comprise a single body.

6. The housing of claim 1,
    wherein the third portion is configured to connect the chip arrangement to an external electrical circuit.

7. The housing of claim 1,
    wherein the third portion comprises a plug-in contact.

8. The housing of claim 1,
wherein the at least one electrical connector is configured to be in thermal connection with the chip arrangement and to transport heat away from the chip arrangement.

9. The housing of claim 1,
wherein the second portion is configured to be in thermal connection with a heat dissipation layer of the chip arrangement.

10. The housing of claim 1,
wherein at least one of the first portion, second portion and third portion comprises a material having a thickness ranging from about 35 µm to about 100 µm.

11. The housing of claim 1,
wherein the first portion of the at least one electrical connector has a length ranging from about 1 mm to about 25 mm.

12. The housing of claim 1, wherein the chip arrangement comprises an embedded power logic system.

13. The housing of claim 1,
wherein the chip arrangement comprises a solid state relay.

14. The housing of claim 1,
wherein the second portion is thermally connected to the at least one chip via the heat-dissipation layer formed over the second chip-carrier side.

15. The housing of claim 1,
wherein the chip-carrier comprises a printed circuit board.

16. The housing of claim 1,
wherein the at least one chip comprises a power device.

17. The housing of claim 1,
wherein the third portion is configured to transport electrical current between the chip arrangement and an external circuit, the electrical current ranging from about 1 A to about 80 A.

18. The housing of claim 1,
wherein the electrical connector comprises at least one of the materials from the following group, the group consisting of: copper, phosphorus, zinc, iron and a copper alloy.

19. The housing of claim 1,
wherein the carrier comprises at least one from the following group of materials, the group consisting of: plastic, polyvinyl chloride PVC, polyethylene terephthalate PET, polyimide PI, Epoxy EP, phenol resin PF, polyamide PA, polypropylene PP, polyethylene PE, a polymer, and a metal-polymer composition.

20. The housing of claim 1,
wherein the carrier comprises at least one of a filler or fiber-reinforced-polymer, the at least one of a filler or fiber-reinforced-polymer comprising at least from one from the group of materials, the group consisting of: plastic, polyvinyl chloride PVC, polyethylene terephthalate PET, polyimide PI, Epoxy EP, phenol resin PF, polyamide PA, polypropylene PP, polyethylene PE, and a polymer.

21. A method for forming a housing for housing a chip arrangement, the method comprising;
receiving a chip arrangement by a first carrier side of a carrier, the carrier further comprising a second carrier side and one or more through-holes extending from the first carrier side to the second carrier side;
inserting at least one electrical connector through a through-hole and arranging the at least one electrical connector to extend from the second carrier side to the first carrier side,
the at least one electrical connector comprising
a first portion on the first carrier side;
a second portion on the first carrier side, the first portion extending away from the first carrier side at an angle to the second portion; and
a third portion on the second carrier side, the third portion extending away from the second carrier side at an angle to the second portion,
wherein the chip arrangement comprises a chip-carrier and at least one chip formed over a first chip-carrier side and wherein a second chip-carrier side faces the first carrier side, and
wherein the at least one electrical connector is thermally connected to the at least one chip via a heat-dissipation layer formed over the second chip-carrier side.

* * * * *